Figure 1:
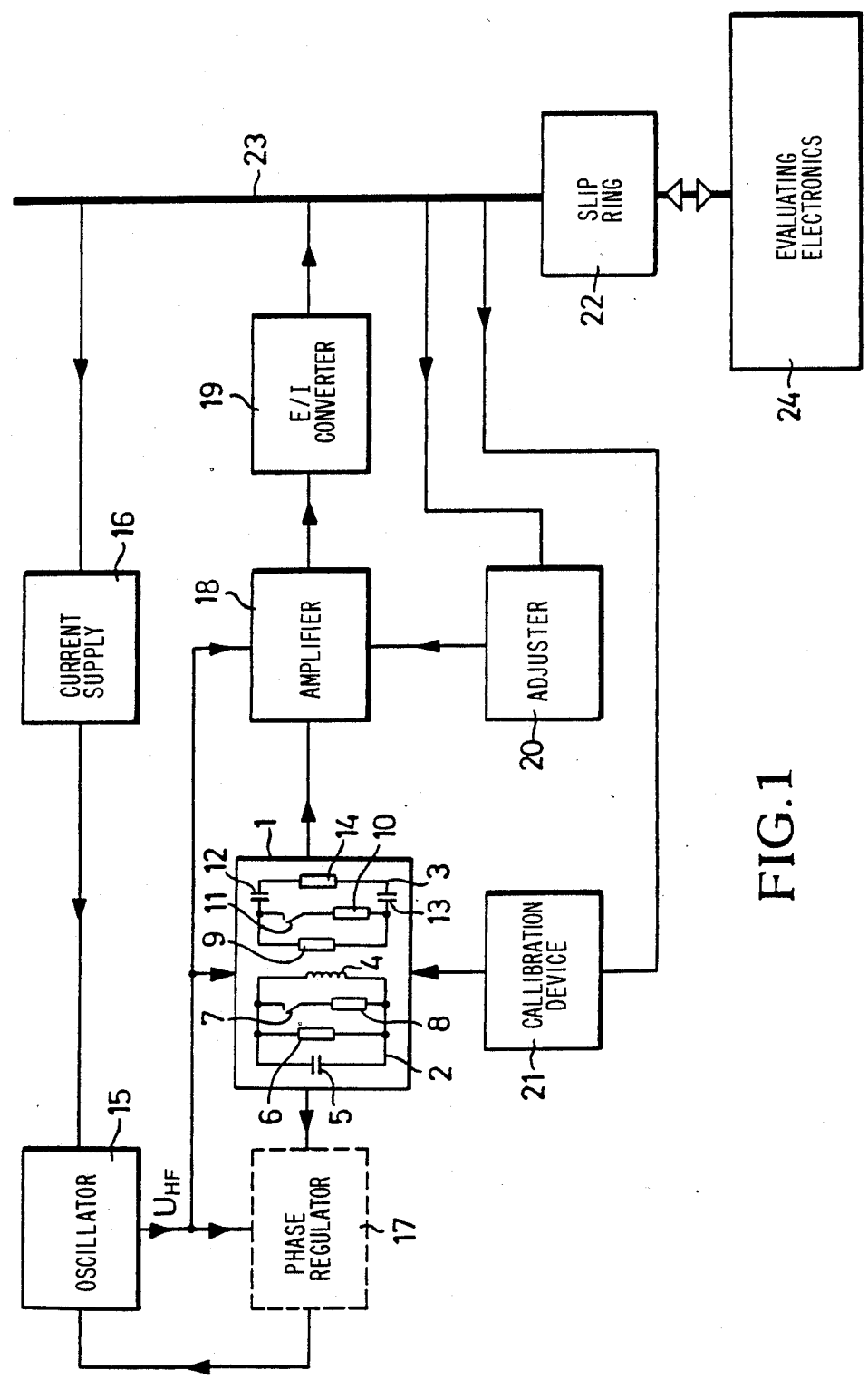

United States Patent [19]

Thorn

[11] Patent Number: 4,958,131

[45] Date of Patent: Sep. 18, 1990

[54] CIRCUIT ARRANGEMENT FOR THE COMBINED APPLICATION OF AN INDUCTIVE AND CAPACITATIVE DEVICE FOR THE NON-DESTRUCTIVE MEASUREMENT OF THE OHMIC RESISTANCE OF THIN LAYERS

[75] Inventor: Gernot Thorn, Hanau, Fed. Rep. of Germany

[73] Assignee: Leybold Aktiengesellschaft, Hanau, Fed. Rep. of Germany

[21] Appl. No.: 345,032

[22] Filed: Apr. 27, 1989

[30] Foreign Application Priority Data

Apr. 30, 1988 [DE] Fed. Rep. of Germany ....... 3815010

[51] Int. Cl.$^5$ ........................ G01B 7/08; G01R 33/20
[52] U.S. Cl. ..................................... 324/708; 324/230
[58] Field of Search ............... 324/62, 61 P, 230, 708, 324/709

[56] References Cited

U.S. PATENT DOCUMENTS

| | | | |
|---|---|---|---|
| 3,064,184 | 11/1962 | Watkiss | 324/230 |
| 3,679,968 | 7/1972 | Commercon et al. | 324/230 |
| 4,000,458 | 12/1976 | Miller et al. | 324/62 |
| 4,208,625 | 7/1980 | Piso | 324/61 R |
| 4,682,105 | 7/1987 | Thorn | 73/159 |
| 4,700,368 | 10/1987 | Munn et al. | 324/230 |
| 4,791,353 | 12/1988 | Typpo | 324/61 R |

FOREIGN PATENT DOCUMENTS

| | | |
|---|---|---|
| 1271823 | 7/1968 | Fed. Rep. of Germany . |
| 1295075 | 5/1969 | Fed. Rep. of Germany . |
| 2115437 | 9/1977 | Fed. Rep. of Germany . |
| 3335766 | 4/1985 | Fed. Rep. of Germany . |
| 1163105 | 9/1969 | United Kingdom . |
| 1552948 | 8/1979 | United Kingdom . |

Primary Examiner—Reinhard J. Eisenzopf
Assistant Examiner—Maura K. Regan
Attorney, Agent, or Firm—Koda & Androlia

[57] ABSTRACT

The invention concerns a circuit arrangement for the combined application of an inductive and capacitative device (2, 3) for the non-destructive measurement of the ohmic resistance of thin layers. Such thin layers are, for instance, produced in high vacuum technology by evaporation. The inductive and capacitative devices (2, 3) are disposed in the immediate vicinity of the layer to be measured and are fed with a high-frequency voltage $U_{HF}$. Since the inductive device (2, 3) has an oscillating circuit (4, 5) which is always continuously tuned to resonance, one is concerned with currents which flow both into the capacitative and the inductive devices (2, 3) and which are proportional to the conductivity of the layer to be measured. By evaluating these currents for which, according to the invention, the same circuity may be used, it becomes possible to make inferences about the surface resistance of the thin layer.

13 Claims, 2 Drawing Sheets

CIRCUIT ARRANGEMENT FOR THE COMBINED APPLICATION OF AN INDUCTIVE AND CAPACITATIVE DEVICE FOR THE NON-DESTRUCTIVE MEASUREMENT OF THE OHMIC RESISTANCE OF THIN LAYERS

DESCRIPTION

The invention concerns a circuit arrangement according to the preamble of claim 1.

In numerous fields it is necessary to establish the properties of thin layers. For instance, it is important to determine the electric resistance of a metallic layer vapour-deposited on a plastics foil or glass plate in a vacuum evaporation coating process in order to be able to influence the production process of such a layer.

The thinner the layers are, the less are measurement processes feasible wherein the layer is mechanically touched, perhaps by electrodes, because the layer to be measured is scratched, pressed through or contaminated by touching. Also with electromechanical measuring processes problems arise with contacting because the layers are often under oxides or other poorly conducting layers.

In order to avoid the disadvantages of mechanical contacting, various indirect measurement methods have already been proposed in which the layer to be measured is not touched.

An arrangement for the electrical measurement of layer thicknesses on running strips is already known wherein sensors are arranged at the surface of a roller which run over the strips (German Published Application No. 33 35 766). These sensors are inductive and capacitative sensors. The inductive sensors have inductor coils embedded in pot cores wherein the pole faces of these pot cores are turned towards a strip. The inductor coils are supplied from a high-frequency generator. The inductive properties of the inductor coil and of the pot core are determined according to the magnitude of the surface resistance or the thickness of the layer to be measured and this misalignment is fed in the form of a measuring signal to an evaluating or analysing circuit. For capacitative sensors an electrode is provided which functions as a capacitor plate, the other capacitor plate being formed by the conductive layer to be measured. Here also the electrode is supplied from a high-frequency generator. The voltage at the electrode is 'disordered' by the surface resistance of the layer and this misalignment is fed as measuring signal to an analysing circuit. It is disadvantageous in this known arrangement that the 'disordered' voltages given off by the inductive and capacitative sensors are of a different nature. Although in both cases these voltages are 'disordered' nevertheless the misalignments—which arise because of the inductive and capacitative reactive components—are not compatible and must therefore be evaluated by quite different types of circuits.

Furthermore, a process for the contactless conductivity measurement is known wherein the electrically conductive layer is brought into the magnetic field of the inductor of an oscillating circuit and wherein the magnetic lines of force penetrate through the layer (German Accepted Specification No. 21 15 437). In this process the electrically conductive layer is penetrated by magnetic lines of force at at least two spatially limited penetration regions in mutually opposite directions. In addition, a reduction in the amplitude of oscillation caused by the eddy currents induced in the electrically conductive layer are analysed as the measure of the electric conductivity. However, this process is not suited for foil-like resistors, because in the known process the measurement object must be brought into a magnetic circuit.

In a further known process for the electrode-less determination of the specific electrical resistance of a test object with the aid of a resonance circuit the test object is moved through the coil of the resonance circuit (German Accepted Specification No. 12 95 075). A specific capacitative device as an addition to an inductive device in order to provide indication to the electrical resistance is not provided here.

Circuitry is furthermore known for measuring the reactive or equivalent resistance components of a test object with the aid of a tuned measuring circuit containing the test object in a parallel connection, where the effect of the tuned measuring circuit on the damping of a coupled capacitative or inductive auxiliary resonance circuitry fed in a high-frequency generator is determined (German Accepted Specification No. 12 71 823). Although with this circuit it is possible to measure the equivalent resistance of a capacitatively coupled test object, nevertheless it does not permit the effective resistance of an inductively coupled test object to be measured also.

The underlying task of the invention is to provide an analysing circuit which can process the output signals of an inductive as well as a capacitative sensor.

This task is solved according to the features of claim 1.

The advantage achieved by the invention consists particularly in that low-impedance and extremely high-impedance surface resistances may be measured directly in the production in vacuum plants for strip coating without touching and such resistances (layers) can be produced via process regulation within narrow tolerances. The low-impedance layers are here measured by the inductive sensor while the high-impedance layers are measured by the capacitative sensor. The inductive and capacitative sensors may here have fully identical external dimensions and identical electrical terminals, since the respective evaluating electronics consist of similar components.

Figure 2:
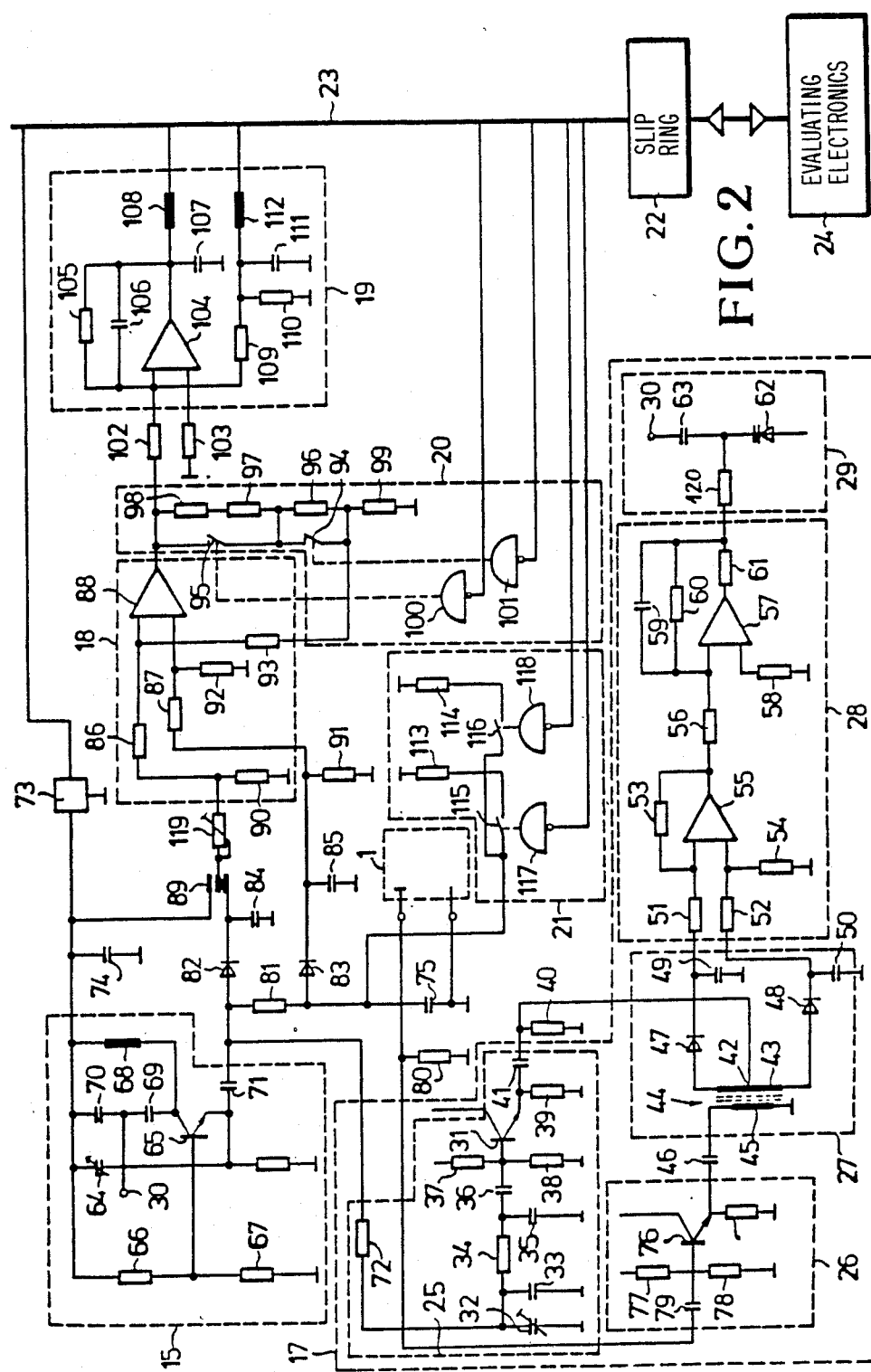

A preferred embodiment of the invention is shown in the drawings and will be described further in what follows. In the drawings:

FIG. 1 is a block diagram of the circuit arrangement according to the invention, and FIG. 2 is a detailed representation of the block diagram shown in FIG. 1.

The circuit arrangement according to the invention is shown in FIG. 1 in the form of a block diagram. An inductive and a capacitative sensor are here together provided with the reference number 1 while the inductive sensor is designated by 2 and the capacitative sensor is designated by 3. The inductive sensor 2 has an inductor 4 which lies opposite the layer to be measured and transforms the ohmic resistance of this layer into a parallel oscillating circuit which essentially is constituted by the inductor 4 and a capacitor 5. The resistance transformed into the oscillating circuit is provided with the reference number 6. A resistor 8 may be into the oscillating circuit by means of a switch 7. For the capacitative sensor 3 the ohmic resistance which opposes the capacitative displacement current in the layer to be measured is designated by 14. Parallel to a base load resistor 9 a further resistor 10 may be connected in by a switch 11. Here two capacitors 12 and 13 represent the divided capacitances between the electrode and the layer to be measured, while the ohmic surface resistance of the layer to be measured is symbolised by the resistor 14.

The resistor 9 is a fixed resistor lying parallel to the electrode. The resistor 10 may be connected in by remote control from an evaluator in order to simulate a resistance layer for calibration purposes.

Both sensors 2, 3 form part of an oscillator 15 supplied with electrical energy from a current supply 16. The inductive sensor 2 is at all times connected with a phase regulator 17 while the capacitative sensor may, but need not, be connected to this phase regulator 17. The task of this phase regulator is primarily so to tune the frequency of the oscillator 15 that the oscillating circuit 4, 5, 6 is always at resonance. When this condition is fulfilled, the total resistance of the oscillating circuit consists only of an ohmic resistor, i.e. during measurement of a layer, the current flowing additionally through the oscillating circuit is a measure of the surface resistance of this layer because this current is defined solely by the oscillator voltage divided by the resistor 6.

The current flowing in the oscillating circuit is fed to an amplifier 18 where it is amplified and passed from there to a voltage-to-current converter 19. The gain of this amplifier 18 may be adjusted by an adjuster 20. The sensors 2 and 3 may be calibrated with the aid of a calibrating device 21.

All the devices 1, 15 to 21 may be disposed in a measuring roller as is illustrated in FIG. 1 of German Published Application No. 33 35 766. The devices 16, 20, 21 are powered via a slip ring transmitter 22 and a bus or collector rail 23 and receive commands from an analysing electronic circuit, whereas the voltage-to-current converter 19 passes data via the slip-ring transmitter 22 out to the evaluating electronics 24.

FIG. 2 shows the circuit arrangement in detail which as regards contents essentially agrees with the block diagram of FIG. 1. The inductive and capacitative sensors 2, 3 are now no longer illustrated because one is here concerned only with the analysis of their output signals. These output signals are of the same value insofar as the currents flowing from the oscillator 15 into the sensors depend on the surface resistance of the thin layer to be measured. The phase regulator 17 consists of several components: a 90°-phase-shifter 25, a preamplifier 26, a rectifier-transformer 27, a two-stage amplifier 28 and a variable capacitance diode (varactor) arrangement 29.

The 90°-phase-shifter 25 has a transistor 31 in front of which are connected two RC-circuits consisting of a resistor 72, a variable capacitor 32, a fixed capacitor 33 parallel thereto, a resistor 34 in the shunt branch, a further parallel capacitor 35 and a series capacitor 36. A voltage divider with the resistors 37 and 38 lies between the capacitor 36 and the base of the transistor 31. The emitter of the transistor is connected to a resistor 39 which forms an RC-circuit with a resistor 40 and a capacitor 41 connected with a central tap 42 of the secondary side 43 of a transformer 44. This transformer 44 is a component of the rectifier-transformer 27, the primary side 45 of the transformer 44 being connected via a capacitor 46 with the amplifier 26 and the secondary side 43 via rectifying diodes 47, 48 and smoothing capacitors 49, 50 with the two-stage amplifier 28. The rectified total voltage of the secondary winding 43 is fed via resistors 51, 52 to the first stage of the two-stage amplifier 28; this stage consists of an operational amplifier 55 connected to resistors 53, 54. The output voltage of the operational amplifier 55 is then fed via a resistor 56 to one input of a second operational amplifier 57, the second input of which is grounded via resistor 58. In the feed-back loop of this operational amplifier 57 there is a parallel connection consisting of a capacitor 59 and a resistor 60. The output signal of the operational amplifier 57 is fed via resistors 61, 120 to the cathode of a varactor 62 as well as to a capacitor 63, the terminal 30 of which is connected to a capacitor 64 of the oscillator 15. This oscillator contains a transistor 65 the base of which is connected to a voltage divider consisting of resistors 66, 67 and the collector of which is connected with a choke coil 68 and a capacitor 69, while the second connection of the choke coil 68 is connected to a capacitor 70 which is also connected with capacitors 69 and 64. The emitter of the transistor 65 is connected to a capacitor 71 which leads to a resistor 72 disposed at the input of the 90°-phase-shifter 25. The oscillator 15 is powered via a voltage regulator 73 fed from the bus 23 and via a smoothing capacitor 74.

As already mentioned above, the output voltage of the oscillator 15 is fed to a sensor 1 which may be an inductive sensor or a capacitative sensor. The output voltage of this sensor 1, which is dropped across a capacitor 75, is passed to the preamplifier 26 which contains a transistor 76 the base of which is connected to a voltage divider consisting of two resistors 77, 78; the division point of the divider being connected via a capacitor 79 with the output of the sensor 1. A resistor 80 is connected in parallel to the capacitor 75 across which the output voltage of the sensor 1 drops.

The output voltage of the inductive sensor is passed to the phase regulator 17, which is so fine-tuned via the terminal 30 of the oscillator 15 that the parallel oscillating circuit in which the inductor 4 is disposed is always in resonance. For the capacitative sensor 3 such an automatic fine-tuning is not required because this sensor 3 has no steep sensitivity characteristic such as that of the inductive resonant sensor. However, the phase regulator 17 may also be used for the capacitative sensor 3 in order to compensate the fluctuations in the thickness of the carrier foil or to compensate the fluctuations in the dielectric constant. The input current of the inductive or capacitative sensor 2, 3 is converted to a voltage via a resistor 81, fed to rectifier diodes 82, 83 and passes from there via storage capacitors 84, 85, a regulating resistor 119 and series resistors 86, 87 to an operational amplifier 88. The regulating resistor 119 may be connected via a solder bridge 89 to the voltage regulator 73.

Additionally, resistors 90, 91 are connected in parallel to the storage capacitors 84, 85 and serve as discharge resistors. One input of the operational amplifier 88 is connected to a grounded resistor 92 while the input of this operational amplifier 88 is connected to a resistor 93 which is connectible via switches 94, 95 with several resistors 96, 97, 98. The resistance 96 is grounded via a further resistor 99. The switches 94, 95 are closed or opened via NOT-gates (negators) 100, 101 controlled from the bus 23. The gain of the amplifier 18 may be altered by the coupling or disconnection of the resistors 96, 97, 98.

The output signal of the amplifier 18 is fed via resistors 102, 103 to the voltage-to-current converter 19 which contains an operational amplifier 104 having a feed-back loop containing a parallel circuit consisting of resistor 105 and capacitor 106. The output current of the operational amplifier 104 passes via a LC-circuit 107, 108 to the bus 23 and from there via the slip-ring transmitter 22 to the analysing electronics 24. The reverse flow of this current ensues via the inductor 112 and the capacitor 111 to ground through the resistor 110. Here the voltage signal arising at the resistor 110 serves to compensate the input voltage of the operational amplifier 104.

The calibrating device 21 contains resistors 113, 114 which may be connected to the sensor 1 by way of respective switches 115, 116. The resistors 113, 114 here play the function of calibrating resistors which are designated in FIG. 1 with 8 and 109, i.e. the resistors 8, 10 of FIG. 1 correspond to the resistor 113 or the resistor 114 or the parallel-connected resistors 113, 114. In their turn the switches 115, 116 are controlled from the bus via negators or NOT-gates 117, 118.

As may be seen from FIG. 2, both the sensors, i.e. the inductive sensor 2 and the capacitive sensor 3 may utilise the same electronic circuit 3. In this way it is possible to evaluate the current flowing into the respective sensor which current is proportional to the surface conductivity of the layer to be measured.

Normally one would assign a discrete circuit arrangement according to FIG. 2 to both the capacitive and inductive sensor which, although then present twice, nevertheless has the advantage of being identically constructed. However, it is also possible in a time-division multiplex operation to make do with only one circuit arrangement whereby this circuit arrangement is connected at a first point in time with the inductive sensor and at a second point in time with the capacitive sensor. Another possibility consists in connecting the inductive and capacitive sensors to the or bus 23 in any desired sequence.

I claim:

1. A circuit arrangement for the non-destructive measurement of the ohmic resistance of a thin layer using combined inductive and capacitive effects, said arrangement comprising:
   an inductive device (2) arranged in the vicinity of the layer to be measured and inducing eddy currents in this layer which weaken the magnetic field of the inductor (4);
   a first capacitive device (3) containing an electrode arranged in the vicinity of the layer to be measured;
   a second capacitive device (5) forming a resonant circuit with said inductive device;
   a high frequency oscillator (15) coupled to said inductive device (2), said second capacitive device (5) and said electrode of said first capacitive device (3) and forming an oscillator circuit with said second capacitive device (5) said inductive device (4) and an ohmic resistance (6) of said thin layer;
   a means for always tuning said oscillating circuit to resonance;
   a means for eliminating an influence of non-ohmic resistance on a predetermined non-ohmic resistance of the capacitive device; and
   a means for detecting a current flow into both the inductive and first capacitive device and for determining the ohmic resistance of said thin layer from said current.

2. A circuit arrangement according to claim 1, characterised in that the high-frequency oscillator (15) has a transistor (65) the collector of which is connected, via a circuit consisting of two capacitors (69, 70) parallel with a coil (68) and a resistor (66), with the base of this transistor (65) and wherein a tap (30) is disposed between the two capacitors (69, 70) which is connected to the phase-shifter (29).

3. A circuit arrangement according to claim 1 characterised in that the detection and evaluation of the current flowing into the inductive device (2) ensues via a circuit arrangement which is essentially identical with the circuit arrangement that detects and evaluates the current flowing into the capacitive device (3).

4. A circuit arrangement according to claim 3, characterised in that the current is amplified by a remotely adjustable amplifier (18).

5. A circuit arrangement according to claim 4, characterised in that the amplifier (18) may be adjusted by remote control in three stages in order always to match it to the desired measurement range.

6. A circuit arrangement according to claim 4, characterised in that the adjustable amplifier (18) has an operational amplifier (88) at the output of which resistors (96, 97, 98) are connectable by way of switches (94, 95).

7. A circuit arrangement according to claim 3, characterised in that the current is converted to a voltage by a voltage-to-current converter (19).

8. A circuit arrangement according to claim 3, characterised in that the apparatus has a remotely controllable calibration device (21) which applies a calibrated load (8,10) to a sensor circuit and thereby simulates a predetermined surface resistance.

9. A circuit arrangement according to claim 8, characterised in that the calibrating device (21) has resistors (113, 114) which may be connected via switches (115, 116) to the inductive or capacitive sensor (2, 3) by an electronic analysing circuit (24).

10. A circuit arrangement according to claim 3 wherein the means for tuning said oscillating circuit to resonance comprises a phase regulator (17).

11. A circuit arrangement according to claim 10, characterised in that the phase regulator (17) serves in the capacitative device (3) to compensate for fluctuations in the thickness of the carrier foil or of its dielectric constants.

12. A circuit arrangement according to claim 10, characterised in that the voltage-to-current converter (19) has an operational amplifier (104) with an RC-feedback circuit (105, 106), the output of the amplifier and the feedback circuit being connected via LC-circuits (107, 108; 111, 112) to an electronic analysing circuit (24).

13. A circuit arrangement according to claim 10, characterized in that the phase regulator (17) comprises a preamplifier (26), a rectifier-transformer (27) coupled to an output of said preamplifier, a 90° phase shifter (25) having its output coupled to a center of a secondary side of said rectifier-transformer, an amplifier (28) coupled to the secondary side of said rectifier-transformer and a phase-shift (29) coupled to the output of said amplifier.

* * * * *